United States Patent [19]
Komuro et al.

[11] Patent Number: 5,610,206
[45] Date of Patent: Mar. 11, 1997

[54] HIGH MOLECULAR WEIGHT COMPOUND HAVING A MONOMER CHAIN FORMING A HOMOPOLYMER RUBBER AND A PHOTOPOLYMERIZABLE RESIN COMPOSITION CONTAINING THE SAME

[75] Inventors: Hirokazu Komuro, Yokahama; Hiromichi Noguchi, Atsugi; Takahiro Mori, Yokahama, all of Japan

[73] Assignee: Canon Kabushiki Kaisha, Tokyo, Japan

[21] Appl. No.: 354,442

[22] Filed: Dec. 12, 1994

Related U.S. Application Data

[63] Continuation of Ser. No. 15,879, Feb. 10, 1993, abandoned, which is a continuation of Ser. No. 323,019, Mar. 14, 1989, abandoned.

[30] Foreign Application Priority Data

Mar. 16, 1988 [JP] Japan .................................. 63-60320
Mar. 9, 1989 [JP] Japan .................................. 1-55088

[51] Int. Cl.$^6$ .............................. C08L 51/06; C08L 51/00
[52] U.S. Cl. .......................... 522/121; 522/149; 522/157; 522/158; 522/153; 522/160; 525/284; 525/922
[58] Field of Search .................................. 522/121, 125, 522/149, 159, 182, 188, 158, 153, 160; 525/922, 284

[56] References Cited

U.S. PATENT DOCUMENTS

| | | | |
|---|---|---|---|
| 3,252,880 | 5/1966 | Magat et al. | 522/125 |
| 3,530,100 | 9/1970 | D'Alelio | 522/149 |
| 3,825,430 | 7/1974 | Kurka | 522/149 |
| 3,974,129 | 8/1976 | De La Mare | 522/149 |
| 4,045,231 | 8/1977 | Toda et al. | 522/149 |
| 4,137,081 | 1/1979 | Pohl | 522/149 |
| 4,192,684 | 3/1980 | Gensho et al. | 522/149 |
| 4,197,130 | 4/1980 | Nakamura et al. | 522/149 |
| 4,320,188 | 3/1982 | Heinz et al. | 522/149 |
| 4,323,636 | 4/1982 | Chen | 522/149 |
| 4,628,022 | 12/1986 | Ors et al. | 525/922 |
| 4,970,532 | 11/1990 | Komuro et al. | 346/140 R |

*Primary Examiner*—Susan W. Berman
*Attorney, Agent, or Firm*—Fitzpatrick, Cella, Harper & Scinto

[57] ABSTRACT

A high molecular weight compound having a number average molecular weight of 5,000 to 30,000 formed from a styrenic or acrylic monomer chain and a rubber chain which are attached as block or graft polymers. A photopolymerizable resin composition includes a copolymer having a number average molecular weight of 5,000 to 30,000. The copolymer has a styrenic or acrylic monomer chain and a rubber chain attached in block or graft form.

3 Claims, No Drawings

5,610,206

HIGH MOLECULAR WEIGHT COMPOUND HAVING A MONOMER CHAIN FORMING A HOMOPOLYMER RUBBER AND A PHOTOPOLYMERIZABLE RESIN COMPOSITION CONTAINING THE SAME

This application is a continuation of application Ser. No. 08/015,879, filed Feb. 10, 1993, now abandoned; which in turn, is a continuation of application Ser. No. 07/323,019, filed Mar. 14, 1989, now abandoned.

FIELD OF THE INVENTION

The present invention relates to a novel high molecular weight compound and a novel photopolymerizable resin composition containing the same as a main component. More particularly, it relates to a novel high molecular weight compound having a number average molecular weight of 5,000 to 30,000 which contains at least one monomer chain part comprising a styrenic chain or an acrylic chain and at least another one monomer chain part of which homopolymer being rubber, and to a novel photopolymerizable resin composition containing said high molecular weight compound as a main component which is capable of providing a desirable cured film of low stress, which excels in adhesion with a member and also in durability and which can satisfactorily follow up thermal stress, mechanical stress and the like to exhibit the functions required therefor.

BACKGROUND OF THE INVENTION

There have been a number of proposed photopolymerizable resin compositions. And such photopolymerizable compositions have been utilized in various industrial products since there are various advantages for them that: they may be easily cured to form films within a short period of time; heating process and drying process which are required, for example, in the case of forming a film from a thermosetting resin composition are not necessitated; and they are suitable for the preparation of a finely structured body. In addition, such photopolymerizable resin compositions have been recently tried to be utilized in permanent industrial products in view that they have such various advantages as above mentioned.

Now, as for the industrial products for which the foregoing photopolymerizable resin compositions are utilized, they are chiefly fine-structured bodies represented by photoresist pattern, adhesives, coatings, etc.

In general, for the photopolymerizable resin composition to be used for the preparation of a fine-structured body, it is necessary not only to have an ability of forming a fine pattern but also to exhibit the required functions as a constituent element thereof, as an adhesive or as a coating even under harsh environment.

However, there are problems for any of the known photopolymerizable resin compositions that when a cured film resulting from the said polymerizable resin composition is disposed as a constituent element on another constituent element comprising a different material such as an inorganic material to obtain a fine-structured body, cracks or peelings are likely to generate at the interface between the two elements of the resultant fine-structured body because of a thermal or mechanical stress which is applied to said interface. Once such cracks or peelings are generated, the strength of the fine-structured body itself becomes insufficient or, said element comprising the photopolymerizable resin composition comes off. There are also other problems for the foregoing fine-structured body in that it will be sometimes deformed or destroyed upon use.

Likewise, there is a similar situation which exists with respect to the known adhesives and coatings containing the known photopolymerizable resin compositions as their main components.

Against this background, there is now an increased demand to develop a photopolymerizable resin composition that makes it possible to provide desirable fine-structured bodies, adhesives and coatings which are free of any of the forgoing problems.

SUMMARY OF THE INVENTION

The present invention is aimed at solving the foregoing problems of the photopolymerizable resin composition in response to the foregoing demand.

A chief object of the present invention is to provide a novel high molecular weight compound having a number average molecular weight of 5,000 to 30,000 which contains at least one monomer chain part comprising a styrenic chain or an acrylic chain and at least another a monomer chain forming a homopolymeric rubber, which makes it possible to provide a desirable polymerizable resin composition capable of satisfying the foregoing demand.

Another object of the present invention is to provide a novel photopolymerizable resin composition containing said novel high molecular weight compound as a main component which exhibits an excellent adhesion and which is usable for the preparation of a structured body, an adhesive, a coating, etc. which are free of problems concerning cracks, peelings and the like which are found on the known photopolymerizable resin composition.

A further object of the present invention is to provide a novel photopolymerizable resin composition containing said novel high molecular weight compound as a main component which makes it possible to provide a desirable structured body which is small in residual stress and which is free of problems such as reduction in the structural strength, deformation, destruction or removal of the constituent element which are found on the known structured body having a constituent element formed of the known photopolymerizable resin composition.

A still further object of the present invention is to provide a novel photopolymerizable resin composition containing said novel high molecular weight compound which makes it possible to provide such a structured body, an adhesive or a coating that excels in durability and is of a prolonged life.

DETAILED DESCRIPTION OF THE INVENTION

The present invention is to attain the foregoing objects and to provide a novel high molecular weight compound and a novel photopolymerizable resin composition containing said high molecular weight compound as a main component.

The high molecular weight compound to be provided according to the present invention is as will be described below.

That is, it is a high molecular weight compound having a number average molecular weight of 5,000 to 30,000 which has (a) a styrenic or acrylic monomer chain part and (b) another monomer chain forming a homopolymeric rubber, said chain part (a) and said chain part (b) being present in block-like or graft-like state, and which contains 50% or more of said monomer chain part (a) on the basis of a weight ratio.

Then, the photopolymerizable resin composition to be provided according to the present invention is that which contains (i) the aforesaid high molecular weight compound, (ii) a photopolymerizable compound having two or more groups selected from the group consisting of acryloyl group and methacryloyl group in one molecule and (iii) a photopolymerization initiator.

In the following, the above-mentioned high molecular weight compound and photopolymerizable composition will be more detailed.

High Molecular Weight Compound

The high molecular weight compound according to the present invention is a high molecular weight compound that has a styrenic or acrylic monomer chain part (this part will be hereinafter called "S&A chain" in short) and another monomer chain forming a homopolymeric rubber (this part will be hereinafter called "G chain" in short). The S&A chain and the G chain are present in block-like state or graft-like state, but they are never randomly copolymerized. The high molecular weight compound according to the present invention is further characterized by containing the S&A chain in an amount of 50% or more, or preferably 60 to 80% on the basis of a weight ratio for the sum of the S&A chain and the G chain and also by having a number average molecular weight in the range of from 5,000 to 30,000.

The high molecular weight compound according to the present invention may be produced in accordance with any of the following methods.

Coupling of an acrylic oligomer with a depolymerized rubber

Method 1

An acrylic oligomer having two or less glycidyl groups in the side chains in one molecule and a depolymerized rubber in which the terminal end is —COOH are subjected to esterification in an organic solvent.

For example, methylmethacrylate and glycidytmethacrylate are subjected to solution polycondensation in toluene by the molar ratio of 97:3 to thereby obtain an oligomer. The resultant is then esterificated with depolymerized rubber having COOH terminal using benzyldimethylamine as a catalyst by stirring the reaction mixture at high speed for about 5 hours while the reaction mixture is being maintained at 80° C.

Method 2

An acrylic oligomer having two or less isocyanate groups in the side chains in one molecule and a depolymerized rubber in which the terminal end is —NH group or —OH group are subjected to a coupling reaction in an organic solvent.

Method 3

An acrylic oligomer having two or less —OH groups in the side chains in one molecule and a liquid maleic anhydride polybutadiene adduct are subjected to esterification in an organic solvent.

Method 4

A styrenic oligomer having two or less acid anhydride groups in one molecule and an epoxy polybutadiene are reacted in a solution containing the two substances.

Block copolymerization by way of living anion polymerization between styrene or methacrylate and isoprene For example, isoprene is subjected to living polymerization in dewatered tetrahydrofuran at −78° C. in which sec-BuLi is used as a polymerization initiator to obtain a product, which is then polymerized with styrene or methacrylate to thereby obtain a block copolymer of the type comprising: [S&A chain]—[G chain]—[S&A chain].

Graft copolymerization of acrylic monomer with depolymerized rubber macromonomer having vinyl group at terminal end For example, polyisobutylene macromonomer having vinyl group at terminal end and methacrylate are subjected to radical copolymerization to thereby obtain a graft copolymer of which trunk chain being [A chain] and of which branched chain being [G chain].

Now, the monomer for the foregoing S&A chain in the high molecular weight compound according to the present invention may be a member selected from the group consisting of the following: styrene, 4-hydroxystyrene, methacrylate, ethylmethacrylate, isobutylmethacrylate, t-butylmethacrylate, benzylmethacrylate, acrylonitrile, dimethylaminoethyl methacrylate, acrylic acid, methacrylic acid, 2-hydroxyethylmethacrylate, 3-chloro-2-hydroxypropyl methacrylate, glycidylmethacrylate, borneolmethacrylate, dicyclopentenylacrylate, dicyclopentenylmethacrylate and cyclohexylmethacrylate.

The monomer for the foregoing G chain in the high molecular weight compound according to the present invention may be a member selected from the following which are illustrated by the polymer denominations: urethane rubber, liquid butyl rubber, liquid butadiene-styrene rubber, liquid acrylonitrile-butadiene rubber, liquid polyisoprene and liquid polyisobutylene, which contain at least one group selected from the group consisting of —COOH —OH,

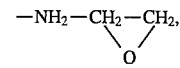

—CH=CH$_2$ and carboxylic anhydride groups at their terminal ends or/and in their molecular chains.

For the high molecular weight compound according to the present invention, it is thought that the foregoing two monomers are present as the respective chains so as to form cyclodomains i.e. domain comprising [G chain] and the other domain comprising [S&A chain] in a structured body comprising a cured film composed of the photopolymerizable resin composition containing the said high molecular weight compound as a main component according to the present invention.

Photopolymerizable Resin Composition

The photopolymerizable resin composition according to the present invention is that which contains the foregoing high molecular weight compound as a main component, a photopolymerizable compound having two or more groups selected from the group consisting of acryloyl group and methacryloyl group in one molecule, and a photopolymerization initiator. The photopolymerizable resin composition according to the present invention may further contain a sensitizing agent capable of promoting the polymerization rate in addition to the foregoing components in case it is necessary.

Explanation will be made about the foregoing photopolymerizable compound, photopolymerization initiator and sensitizing agent to be used in the present invention.

Photopolymerizable Compound

As the photopolymerizable compound to be employed in the photopolymerizable resin composition according to the present invention, there can be illustrated those compounds having two or more groups selected from the group consisting of acryloyl group and methacryloyl group in one molecule, which will be mentioned below: (1) acrylic acid or methacrylic ester of multifunctional epoxy resin having two or more epoxy groups in one molecule, (2) acrylic acid or methacrylic ester of multifunctional alcohol having two or more hydroxy groups in one molecule, (3) polyurethane acrylate obtained by reacting polyester, polyether or liquid depolymerized rubber having —OH group or —COOH group at terminal end, diisoyanate and acrylate having hydroxy group, and (4) a compound selected from the group consisting of acrylic esters of melamine, triallylcyanurate and triallylisocyanurate and triacrylisocyanurate.

These compounds as the photopolymerization initiator are selectively used for the photopolymerizable resin composition according to the present invention depending upon its application purpose.

In practice, the photopolymerizable resin composition according to the present invention does not contain monofunctional acrylate or monofunctional methacrylate. However, it is possible to incorporate such compound in the said composition in such a small amount that the effects of the present invention are not hindered. In this case, reduction in the viscosity and an improvement in the wetting property can be expected on the photopolymerizable resin composition according to the present invention.

Photopolymerization Initiator

As the photopolymerization initiator to be employed in the photopolymerizable resin composition according to the present invention, there can be illustrated those which will be mentioned below: (1) benzoin ethers such as benzoinisobutyl ether, benzoinmethyl ether and benzoinethyl ether, (2) alpha-acryloxime esters such as 1-phenyl-1,2'-propanedion-2-(O-ethoxycarbonyl) oxime, (3) benzyl ketals such as 2,2-dimethoxy-2-phenyl acetophenonebenzyl hydroxy cyclohexyl phenylketone, (4) acetophenones such as diethoxyacetophenone 2-hydroxy-2-methyl-1phenylpropane-1-on, and (5) aromatic ketones such as benzophenone, chlorothioxanthone, 2-chlorothioxanthone, isopropylthioxanthone, 2-methylthioxanthone, 2-ethylanthraquinone and 2-t-butyl anthraquinone.

Sensitizing Agent

As the sensitizing agent to be optionally contained in the photopolymerizable resin composition according to the present invention, there can be illustrated proton-imparting compounds capable of promoting the polymerization rate such as n-butylamine, triethylamine, diethylaminoethylmethacrylate, 4,4-bis(diethylamino)benzophenone, 4-dimethylaminoacetophenone and N-ethyldiethanolamine.

Other Additives

Where necessary, the photopolymerizable resin composition according to the present invention may further optionally contain additives, for example, stabilizers capable of prohibiting dark reaction such as hydroquinone or paramethoxyphenol, colorants such as dyes and pigments, leveling agents imparting coating stability such as silica, talc, alumina and clay, extender pigments such as sedimenting barium sulfate, and flameproofing agents.

The constitutional ratios of the foregoing high molecular weight compound (i), photopolymerizable compound (ii) and photopolymerization initiator (iii) for the photopolymerizable resin composition according to the present invention are properly determined upon the application purpose.

In a preferred embodiment, the weight ratio of the high molecular weight compound (i) to the photopolymerizable compound (ii) is desired to be made such that (i):(ii) is preferably in the range of from 100:50 to 100:300, or more preferably in the range of from 100:80 to 100:200 in parts by weight. And the weight ratio of the sum of the high molecular weight compound (i) and the photopolymerizable compound (ii) to the photopolymerization initiator (iii) is desired to be made such that [(i)+(ii)]:(iii) is preferably in the range of from 100:2 to 100:10 or more preferably in the range of from 100:3 to 100:7 in parts by weight.

The photopolymerizable resin composition according to the present invention as explained above may be applied onto an appropriate substrate in accordance with any of the conventional methods. Specific examples of such methods will be illustrated below. (1) The photopolymerizable resin composition in liquid state is applied onto a substrate to form a liquid coat thereon, which is followed by evaporation to dryness. Then, the resultant dried coat is cured by irradiating it with a light energy such as ultraviolet rays (UV-rays) from high pressure mercury lamp. (2) A dry film is prepared from the photopolymerizable resin composition in liquid state. Then, when used, the dry film is laminated on the surface of a substrate and cured in the same manner as in the above case (1).

As the solvent to be used when the photopolymerizable resin composition is used in the form of a liquid, there can be illustrated, for example, toluene, xylene, methyl ethyl ketone, methyl isobutyl ketone, ethyl acetate, butyl acetate, cyclohexane, cellosolves and alcohols. These organic solvents may be used alone or in combination.

For the known liquid rubber series photopolymerizable resin compositions, there is a limit to the kind of solvent which can be used. For example, a high polar solvent cannot be used since such resin composition is hardly resolved therein. However, for the photopolymerizable resin composition according to the present invention, there is no such limit to the solvent to be used.

Now, a cured product obtained from the photopolymerizable resin composition according to the present invention is characterized by generating desirably low stress against a strain generated at the time of curing the resin composition or other strains generated thermally or mechanically upon its use.

The stress ($\sigma$) which the said cured product receives because of such strain as mentioned above can be expressed by the equation: $\sigma = k \times e \times E$, where k is a constant, e is a strain and E is a modulus of elasticity for a cured product.

From the above equation, it is understood that when the modulus of elasticity E is decreased, it is possible to lower the stress of a cured product.

In view of this, the reason for the cured product obtained from the photopolymerizable resin composition according to the present invention being of low stress is considered to be, that the G chain capable of providing a stress-relaxing effect is present as a microdomain in a waving-like structure within the A&S chain to act as a stress absorber by lowering the modulus of elasticity for the cured product. In addition, it is also considered that because of the rubber component's waterproof and solvent resistance, the cured product is hardly affected by water or an organic solvent.

In fact, the cured product obtained from the photopolymerizable resin composition according to the present invention provides a desirable stress-relaxing effect, a desired adhesion to a different element and a desired durability lasting for a long period of time.

PREFERRED EMBODIMENTS OF THE INVENTION

The following examples serve to illustrate the invention in more detail but the invention is not limited to the examples.

EXAMPLES OF SYNTHESIS

Synthesis Example 1

A liquid mixture composed of 90 g of methylmethacrylate, 10 g of glycidylmethcrylate, and 100 g of DMF was sufficiently bubbled with $N_2$ to thereby remove $O_2$, to which 0.2 g of azobisisobutyronitrile was added while maintaining the liquid mixture at 70° C. to carry out thermal polymerization for 5 hours. To the resultant, there were added 60 g of liquid 1,2-polybutadiene (Mw=1000) having a carboxyl group at one terminal end and 0.1 g of 2,4,6-tri(dimethylaminomethyl)phenol, and the resultant reaction mixture was subjected to condensation reaction at 70° C. for 5 hours to thereby obtain acrylic polymer of the structural formula (I) shown in Table 1 which has a number average molecular weight of 15,000.

Synthesis Example 2

1000 g of heptane, 0.31 g of titanium trichloride, 0.46 g of triethyl aluminum and 2.95 g of diethylzinc were introduced into an autoclave charged with argon gas. The reaction system was maintained at 0.6 atm. for butylene pressure to carry out polymerization reaction at 40° C. for 2 hours, thereby obtaining polybutylene. The resultant polybutylene was filtrated under nitrogen gas atmosphere, which was followed by dispersing into 1000 ml of heptane. To the resultant dispersion, 3.65g of cumene hydroperoxide and 70 g of methylmethacrylate were added to obtain a mixture, which was followed by stirring at 40° C. for 3 hours. The resultant was filtrated under nitrogen gas atmosphere and was treated with methanol-hydrochloric acid at room temperature for 12 hours. The resultant was extracted with acetone and methanol to thereby obtain polybutyne of the structural formula (II) shown in Table 1 which has a number average molecular weight of 20,000.

Synthesis Example 3

A mixture composed of methylmethacrylate and glycidylmethacrylate (97:3 by molar ratio) was dissolved in toluene, which was followed by solution polymerization at 80° C. for 3 hours using azobisisobutylonitrile as the polymerization initiator to thereby obtain acrylic oligomer having a number average molecular weight of 7,000. This oligomer was suspended in a solution of HycarCTBN (trade name of Ube Kohsan K.K., molecular weight: 3,400), which is a COOH-terminated NBR rubber in liquid state, which was dissolved in a solvent composed of xylene and 1,1,1-trichloroethan (50:50) to thereby obtain a suspension, which was followed by reaction in the presence of a catalyst comprising tetrabutylammonium hydrochloride at 90° C. for 5 hours.

An excessive amount of methylethyl ketone was added to the reaction product to precipitate a liquid rubber product, which was separated from the remaining solution to thereby obtain acrylic polymer of the structural formula (III) shown in Table 1 which has a number average molecular weight of 15,000.

Synthesis Example 4

Polymethylmethacrylate and carbamoylethylmethacrylate were subjected with the molar ratio of 90:10 to solution polymerization in dehydrated and dried toluene at 70° C. for 5 hours to obtain acrylic polymer having a number average molecular weight of 13,000. This solution containing said acrylic polymer was maintained at 70° C., and a toluene solution containing an OH-terminated butadiene rubber in liquid state (Poly-bd R-45M of Idemitsu Petroleum Chemical Co., Ltd., molecular weight: 2,000) was added to the aforesaid solution being maintained at 70° C., which was followed by reaction for 6 hours. After the reaction was completed, an excessive amount of methylethyl ketone was added to the resultant solution to remove precipitated unreacted liquid rubber, thereby obtaining graft copolymer of the structural formula (IV) shown in Table 1 which has a number average molecular weight of 27,000.

Synthesis Example 5

Methylmethacrylate, isobornylmethacrylate and 2-hydroxyethylmethacrylate were subjected with the molar ratio of 70:20:10 to solution polymerization in xylene in which azobisisobutylonitrile as the catalyst and t-dodecyl mercaptan as the chain transfer agent were present, to thereby obtain acrylic polymer having a number average molecular weight of 14,000. A xylene solution containing BN-1010 of Nisso PB resin (product of Nihon Soda K.K.) was added to the foregoing xylene solution containing the resultant acrylic polymer while stirring at 80° C., and the reaction mixture was refluxed for 8 hours to thereby obtain polymer of the structural formula (V) shown in Table 1 which has a number average molecular weight of 17,000.

Synthesis Example 6

Styrene and maleic anhydride were subjected with the molar ratio of 90:10 to copolymerization by way of the conventional method, to thereby obtain polymer having a number average molecular weight of 5,000. Epoxy polybutadiene BF-1000 (product of Adeka Argus K.K.) was added to a solution of this polymer in a solvent comprising methylisobutyl ketone/toluene (50:50 by the weight ratio) while stirring at 70° C. and the reaction mixture was engaged in reaction for 3 hours, to thereby obtain graft copolymer having the structural formula (VI) shown in Table 1 which has a number average molecular weight of 7,000.

Synthesis Example 7

Using macromonomer having polyisobutadiene rubber chain which is represented by the structural formula (VIII) shown in Table 1, it was subjected to anion copolymerization with methylmethacrylate in the presence of sec-butyl Li as the catalyst in tetrahydrofuran at −78° C. to thereby obtain graft copolymer of the structural formula (VII) which has a number average molecular weight of 9,600.

Composition Examples For The Photopolymerizable Resin Composition

Examples 1 to 8

There were prepared eight kinds of photopolymerizable resin compositions of the present invention using the foregoing seven kinds of high molecular weight compounds obtained in Synthesis Examples 1 to 7 (Examples 1 to 8).

In each case, other than the high molecular weight compound obtained in the above synthesis example, the photopolymerizable compound and the photopolymerization initiator were used as mentioned in Table 2. And, they were well mixed by the weight ratios (parts by weight) as shown in Table 2 to obtain a photopolymerizable resin composition. In this way, eight kinds of photopolymerizable resin composition samples were prepared (Examples 1 to 8).

Comparative Examples 1 to 2

In Comparative Example 1, Dinal RB 80 (product of Mitsubishi Rayon Co., Ltd.) as the high molecular weight compound was used. And in Comparative Example 2, a copolymer having a number average molecular weight of 50,000 obtained by polymerizing methylmethacrylate, acrylic acid and 2-hydroxyethylmethacrylate with the molar ratio of 85:5:10 as the high molecular weight compound was used. As for the photopolymerizable compound and the photopolymerization initiator to be used in each case, those mentioned in Table 2 were used. In the same manner as in the foregoing Examples, two comparative photopolymerizable resin composition samples were prepared (Comparative Examples 1 to 2).

Evaluations

Each of the foregoing samples was dissolved in the solvent as mentioned in Table 2 to obtain a coating liquid. Using the conventional roll coater, the resultant coating liquid was applied onto a TETLAR film (product of Du Pont Co., Ltd.) in an amount to attain 50 μm thickness after dryness to thereby form a liquid coat on the film. The liquid coat was then air-dried at 100° C. for 10 minutes to thereby obtain a dry film of about 50 μm in thickness.

The thus obtained dry film was exposed to UV rays from high pressure mercury lamp with the output of 100 mW/cm$^2$ for 50 seconds to thereby cure the dry film. The thus cured film was removed from the substrate film, and it was set to the known forced vibration dynamic viscoelasticity measuring device (product of Toyo Seiki K.K.) to measure a Tg and a modulus of elasticity for the cured film. The measured results were as shown in Table 3.

From the results shown in Table 3, the following are understood for the photopolymerizable resin composition according to the present invention.

That is, the Tg is in the range of from 105° C. to 130° C., the modulus of elasticity at 25° C. is of a value of $10^8$ to $10^9$ and the point for the coefficient of linear expansion to be greatly altered (that is, the point where it becomes greater) is not distinguishably different from that for the known photopolymerizable resin composition. And as for the strain against mechanically or thermally applied external forces, there is not a significant difference between the photopolymerizable resin composition according to the present invention and the known photopolymerizable resin composition.

However, the modulus of elasticity for the photopolymerizable resin composition according to the present invention is significantly different, namely by one or more figures, from that for the known photopolymerizable resin composition.

In view of this, it is recognized that a cured product obtained from the photopolymerizable resin composition according to the present invention is free of problems of occurrences of cracks or peelings which are found on a cured product obtained from the known photopolymerizable resin composition.

In addition, the following facts have been experimentally found for the photopolymerizable resin composition according to the present invention that: (i) it exhibits an excellent adhesion which is usable for the preparation of a structured body, an adhesive, a coating, etc. which are free of problems concerning cracks, peelings and the like which are found on the known photopolymerizable resin composition: (ii) it makes it possible to provide a desirable structured body which is small in residual stress and which is free of problems such as reduction in the structural strength, deformation, destruction or removal of the constituent element which are found on the known structured body having a constituent element formed of the known photopolymerizable resin composition: and (iii) it makes it possible to provide such a structured body, an adhesive or a coating that excels in durability and has a prolonged life.

Structural formula (I)

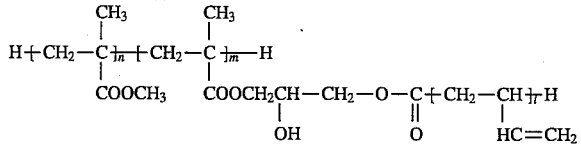

Structural formula (II)

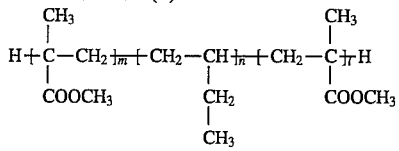

Structural formula (III)

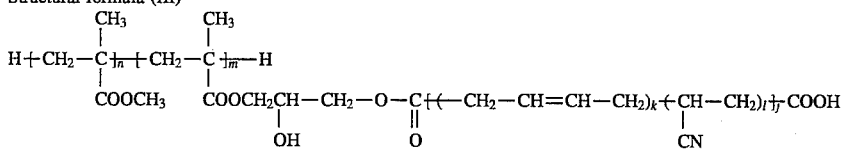

Structural formula (IV)

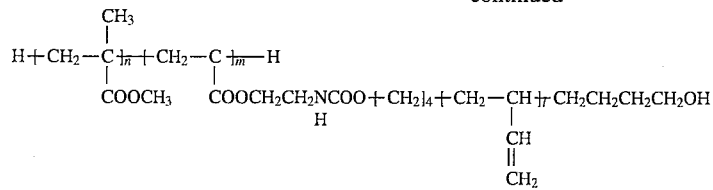

Structural formula (V)
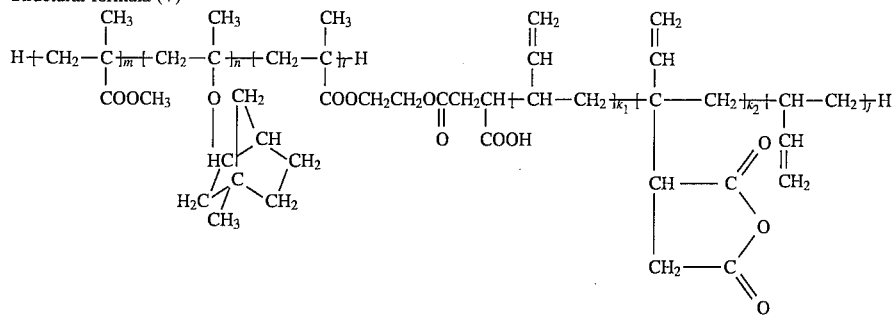

Structural formula (VI)
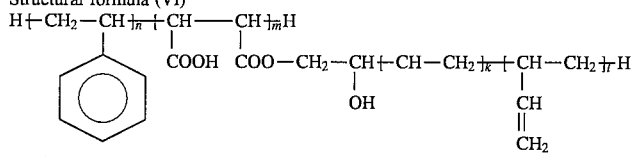

Structural formula (VII)
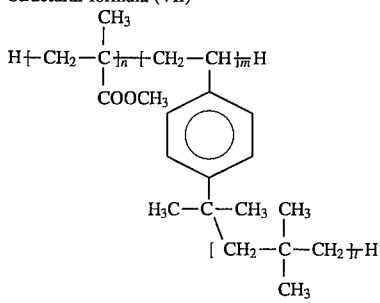

Structural formula (VIII)
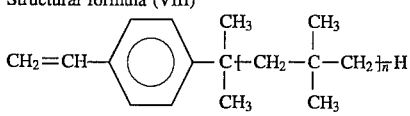

TABLE 2

| Composition Examples 1 to 8 : photopolymerizable resin compositions of the present invention | | | | |
|---|---|---|---|---|
| high molecular compound | | | photopolymerizable compound | |
| Example | | | | |
| 1 | Synthesis Example 1: | 50 parts | acrylic ester of Epicoat 828*3 | 40 parts |
|   |   |   | trimethylolpropanetriacrylate | 40 parts |
| 2 | Synthesis Example 2: | 60 parts | acrylic ester of Epicoat 828*3 | 40 parts |
|   |   |   | trimethylolpropanetriacrylate | 40 parts |
| 3 | Synthesis Example 3: | 40 parts | Aronix M-1100*4 | 40 parts |
|   |   |   | Aronix M-215*5 | 20 parts |
| 4 | Synthesis Example 4: | 40 parts | photomer 6008*6 | 50 parts |
|   |   |   | Aronix M- 215 | 20 parts |
| 5 | Synthesis Example 5: | 50 parts | triarylisocyanurate | 40 parts |
|   |   |   | triethyleneglycoldiacrylate | 30 parts |
| 6 | Synthesis Example 6: | 50 parts | triarylisocyanurate | 40 parts |
|   |   |   | dipropylenglycoldimethyl- | 30 parts |
|   |   |   | methacrylate |   |
| 7 | Synthesis Example 7: | 40 parts | acrylic acid ester of hydrogenated bisphenol | 60 parts |
|   |   |   | A diglycidyl ether |   |
| 8 | Synthesis Example 6: | 40 parts | acrylic acid ester of hydrogenated bisphenol | 30 parts |

TABLE 2-continued

Composition Examples 1 to 8 : photopolymerizable resin compositions of the present invention

|  |  |  | A diglycidyl ether melaminetriacrylate | 30 parts |
|---|---|---|---|---|
| Comparative Composition Example |  |  |  |  |
| 1 | Dianal BR80 (product of Mitsubishi Rayon K.K.) polymethylmethacrylate | 50 parts | acrylic ester of Epicoat 828 trimethylolpropanetriacrylate | 40 parts 10 parts |
| 2 | copolymer obtained by copolymerization of methylmethacrylate, acrylic acid and 2-hydroxymethacrylate (85:5:10 by molar ratio) (number average molecular weight: 50,000) | 50 parts | triallylisocyanurate Epoxy ester 3002A*[7] | 40 parts 30 parts |

|  |  | photopolymerization initiaor |  | solvent |
|---|---|---|---|---|
| Example |  |  |  |  |
| 1 |  | Irugacure 184*[1] | 3 parts | DMF |
| 2 |  | Irugacure 184 | 3 parts | heptane |
| 3 |  | Irugacure 651*[2] | 5 parts | toluene |
| 4 |  | Irugacure 651 | 5 parts | toluene |
| 5 |  | benzophenone 4-dimethylaminoacetophenone | 4 parts 2 parts | xylene |
| 6 |  | benzophenone 4-dimethylaminoacetophenone | 4 parts 2 parts | TIM/toluene (weight ratio: 50:50) |
| 7 |  | Irugacure 651 | 4 parts | THF |
| 8 |  | Irugacure 651 | 4 parts | TIM/toluene (weight ratio: 50:50) |
| Comparative Composition Example |  |  |  |  |
| 1 |  | Irugacure 184 | 3 parts | toluene |
| 2 |  | benzophenone 4-dimethylaminoacetophenone | 4 parts 2 parts |  |

Note: parts mean parts by weight
*[1] the trade name of Ciba Geigy Co.: hydroxycyclohexylphenylketone
*[2] the trade name of Ciba Geigy Co.: 2,2-dimethoxy-2-phenylacetophenone
*[3] the trade name of Yuka Shellepoxy K.K.: bisphenol A epoxyresin
*[4] the trade name of Toa Gohsei K.K.: polyester series urethanacrylate
*[5] the trade name of Toa Gohsei K.K.: diacrylate having an isocyanulate nucleus
*[6] the trade name of Sannobuko K.K.: aromatic urethanacrylate (structure unknown)
*[7] the trade name of Kyoeisha Yushikagaku kohgyo K.K.: diacrylate of bisphenol A derivative

TABLE 3

The Tg and the modulas of elasticity for a cured film

|  | Tg measured by dynamic viscoelasticity | modulas of elasticity at 25° C. (dyn/cm$^2$) |
|---|---|---|
| Composition Example 1 | 113° C. | $1.5 \times 10^9$ |
| Composition Example 2 | 110° C. | $1.8 \times 10^9$ |
| Composition Example 3 | 120° C. | $9.5 \times 10^8$ |
| Composition Example 4 | 105° C. | $9.0 \times 10^8$ |
| Composition Example 5 | 130° C. | $2.0 \times 10^9$ |
| Composition Example 6 | 110° C. | $8.5 \times 10^8$ |
| Composition Example 7 | 108° C. | $8.5 \times 10^8$ |
| Composition Example 8 | 116° C. | $1.0 \times 10^9$ |
| Comparative Composition Example 1 | 125° C. | $3.5 \times 10^{10}$ |
| Comparative Composition Example 2 | 120° C. | $5.0 \times 10^{10}$ |

What is claimed is:

1. A photopolymerizable resin composition consists essentially of:

(i) a block or graft polymer having a number average molecular weight of 5,000 to 30,000 comprising (a) a styrenic or acrylic polymer chain and (b) a rubber homopolymer chain, said block or graft polymer comprising 60 to 80% of said of said styrene or acrylic polymer chain (a) based on the total weight of (a) and (b), and said chain (a) and said chain (b) being present in the block or graft state, (ii) a photopolymerizable compound having two or more groups selected from the group consisting of acryloyl group and methacryloyl group in one molecule, and (iii) a photopolymerization initiator.

2. A photopolymerizable resin composition according to claim 1, wherein the weight ratio of said block or graft polymer (i) to said photopolymerizable compound (ii) is in the range of from 100:50 to 100:300 in parts by weight, and the weight ratio of the sum of said block or graft polymer (i) and said photopolymerizable compound (ii) to said photopolymerization initiator (iii) is in the range of from 100:2 to 100:10 in parts by weight.

3. A photopolymerizable resin composition according to claim 2, wherein said photopolymerization initiator includes a amino-functional compound capable of promoting the polymerization rate.

* * * * *

UNITED STATES PATENT AND TRADEMARK OFFICE
CERTIFICATE OF CORRECTION

PATENT NO. : 5,610,206

DATED : March 11, 1997

INVENTOR(S): HIROKAZU KOMURO, ET AL.

It is certified that error appears in the above-identified patent and that said Letters Patent is hereby corrected as shown below:

COLUMN 3

Line 40, "glycidytmethacry-" should read
      --glycidylmethacry---.

COLUMN 4

Line 40,"cyclodomains" i.e." should read
      --cyclodomains, i.e., a--.

COLUMN 5

Line 10, "diisoyanate" should read --diisocyanate--.
    Line 12, "triallylcyanurate" should read
      --triarylcyanurate--.
    Line 13, "triallylisocyanurate" should read
      --triarylisocyanurate--.
    Line 35, "1,2'-" should read --1,2---.
    Line 36, "propanedion-" should read --propane-dion---.

COLUMN 6

Line 63, "waterproof" should read --waterproofness--.

UNITED STATES PATENT AND TRADEMARK OFFICE
CERTIFICATE OF CORRECTION

PATENT NO. : 5,610,206

DATED : March 11, 1997

INVENTOR(S): HIROKAZU KOMURO, ET AL.

Page 2 of 3

It is certified that error appears in the above-identified patent and that said Letters Patent is hereby corrected as shown below:

COLUMN 7

Line 51, "azobisisobutylonitrile" should read
--azobisisobutyronitrile--.
Line 57, "1,1,1-trichloroethan" should read
--1,1,1-trichloroethane--.

COLUMN 8

Line 24, "azobisisobutylonitrile" should read
--azobisisobutyronitrile--.

COLUMN 10

Line 43, Insert heading: --TABLE 1--.

COLUMN 13

Table 2-continued, Line 40, "isocyanulate" should
read --isocyanurate--.
Table 3 Line 47, "modules" should read --modulus--.
Table 3 Line 50, "modulas" should read --modulus--.

UNITED STATES PATENT AND TRADEMARK OFFICE
CERTIFICATE OF CORRECTION

PATENT NO. : 5,610,206

DATED : March 11, 1997

INVENTOR(S) : HIROKAZU KOMURO, ET AL.

It is certified that error appears in the above-identified patent and that said Letters Patent is hereby corrected as shown below:

COLUMN 14

```
Table 2-continued, "triallylisocyanurate" should read
    --triarylisocyanurate--.
Table 3-continued Line 48, "modules" should read
    --modulus--.
Table 3-continued Line 50, "modulas" should read
    --modulus--.
Line 59, "consists" should read --which consists--.
```

COLUMN 16

```
Line 7, "a" should read --an--.
```

Signed and Sealed this

Fourteenth Day of October, 1997

*Attest:*

BRUCE LEHMAN

*Attesting Officer*   Commissioner of Patents and Trademarks